US006897488B2

(12) United States Patent  (10) Patent No.: US 6,897,488 B2
Baur et al.                (45) Date of Patent:     May 24, 2005

(54) RADIATION-EMITTING CHIP

(75) Inventors: Johannes Baur, Deuerling (DE);
Dominik Eisert, Regensburg (DE);
Michael Fehrer, Bad Abbach (DE);
Berthold Hahn, Hemau (DE); Volker Härle, Waldetzenberg (DE); Ulrich Jacob, Regensburg (DE); Raimund Oberschmid, Sinzing (DE); Werner Plass, Regensburg (DE); Uwe Strauss, Bad Abbach (DE); Johannes Völkl, Erlangen (DE); Ulrich Zehnder, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/415,810

(22) PCT Filed: Nov. 6, 2001

(86) PCT No.: PCT/DE01/04171
§ 371 (c)(1),
(2), (4) Date: Oct. 2, 2003

(87) PCT Pub. No.: WO02/37578
PCT Pub. Date: May 10, 2002

(65) Prior Publication Data
US 2004/0048429 A1 Mar. 11, 2004

(30) Foreign Application Priority Data
Nov. 6, 2000 (DE) .......................................... 100 54 966

(51) Int. Cl.⁷ .............................................. H01L 33/00
(52) U.S. Cl. .............................. 257/95; 257/98; 257/94
(58) Field of Search ............................. 257/95, 98, 94

(56) References Cited

U.S. PATENT DOCUMENTS 3,852,798 A * 12/1974 Leabailly et al. ............. 257/85
4,398,239 A *  8/1983 de Vos et al. ............... 362/263

(Continued)

FOREIGN PATENT DOCUMENTS

| DE | 944 387      | 6/1956  |
| DE | 25 38 248    | 8/1975  |
| DE | 195 36 438   | 9/1995  |
| EP | 0 415 640    | 3/1991  |
| EP | 0 562 880    | 9/1993  |
| JP | 59-205774    | 5/1983  |
| JP | 61-110476    | 11/1984 |
| JP | 06338630 A   | 12/1994 |
| JP | 07038147 A   | 2/1995  |
| WO | WO 96/37000  | 11/1996 |

OTHER PUBLICATIONS

S.V. Galginaitis, "Improving the External Efficiency of Electroluminescent Diodes", Journal of Applied Physics, vol. 36, No. 2, Feb. 1965, pp. 460–461.

*Primary Examiner*—David Nelms
*Assistant Examiner*—Tu-Tu Ho
(74) *Attorney, Agent, or Firm*—Cohen, Pontani, Lieberman & Pavane

(57) ABSTRACT

A light-emitting chip (3) has a lens-type coupling-out window (4), whose base area (5) is provided with a mirror area (6). Arranged on a coupling-out area (7) of the coupling-out window (4) is a layer sequence (9), with a photon-emitting pn junction (10). The photons emitted by the pn junction are reflected at the mirror area (6) and can leave the coupling-out window (4) through the coupling-out area (7).

24 Claims, 5 Drawing Sheets

U.S. PATENT DOCUMENTS

| | | | |
|---|---|---|---|
| 5,055,892 A | * 10/1991 | Gardner et al. | 257/99 |
| 5,087,949 A | 2/1992 | Haitz | |
| 5,273,933 A | * 12/1993 | Hatano et al. | 117/89 |
| 5,349,211 A | * 9/1994 | Kato | 257/90 |
| 5,429,954 A | 7/1995 | Gerner | |
| 5,521,747 A | * 5/1996 | Engle | 359/292 |
| 5,923,053 A | * 7/1999 | Jakowetz et al. | 257/95 |
| 6,025,251 A | 2/2000 | Jakowetz et al. | |
| 6,255,707 B1 | * 7/2001 | Bylsma et al. | 257/414 |
| 6,426,787 B1 | * 7/2002 | Satake et al. | 349/138 |
| 2002/0030194 A1 | * 3/2002 | Camras et al. | 257/98 |

\* cited by examiner

RADIATION-EMITTING CHIP

This is a U.S. national stage of application Ser. No. DE01/04171, filed on 06 Nov. 2001.

FIELD OF THE INVENTION

The invention relates to a radiation-emitting chip having a photon-emitting active region and a coupling-out window which is assigned to the latter, in particular adjoins the latter, and has a coupling-out area via which at least a part of the radiation emitted by the active region is coupled out from the chip.

U.S. Pat. No. 5,087,949 A discloses a light-emitting diode chip having an n-doped coupling-out window in the shape of a truncated pyramid. A p-conducting layer is formed along the base area of the n-conducting base body. An insulating layer interrupted by a central window is situated below the p-conducting layer. In the window, the p-conducting layer is contact-connected by a contact layer. A further contact layer is situated on the top side of the base body in the shape of a truncated pyramid. Through the insulating layer, the current flow through the p-conducting layer and the n-conducting base body is restricted to the region of the window. When current flows, photons are emitted in the region of the window along the interface between the p-conducting layer and the n-conducting base body. On account of the base body configuration in the shape of a truncated pyramid, a large part of the photons impinge on a coupling-out area of the base body in the shape of a truncated pyramid at an angle which is less than the critical angle for total reflection. As a result, this known component has a comparatively high luminous efficiency.

One disadvantage of the known light-emitting diode chip is that the pn junction is situated at the mounting side of the chip. In the case of mounting using electrically conductive silver-epoxy adhesive, there is therefore a high risk that adhesive swelling up laterally will electrically short-circuit the active region, leading to the failure of the component.

SUMMARY OF THE INVENTION

One object of the invention is to provide an improved radiation-emitting chip of the type described above in which, in particular, the risk of a short circuit of the active region or a part of the active region is eliminated to the greatest possible extent.

This and other objects are attained in accordance with one aspect of the invention directed to a chip for optoelectronics, in particular an LED chip, having a photon-emitting active region and a coupling-out window having at least one coupling-out area, wherein the active region is arranged downstream of the coupling-out window relative to a main radiation direction of the chip. A mirror area is formed on that side of the coupling-out window which is opposite to the active region, and the coupling-out areas project laterally beyond the side areas of the active region.

According to an embodiment of the invention, the active region of the chip has a cross-sectional area perpendicular to the chip axis which is smaller than a cross-sectional area of the coupling-out window that is perpendicular to the chip axis, and the active region is arranged downstream of the coupling-out window in the radiation direction of the chip. A mirror area is formed at that side of the coupling-out window which is remote from the active region and hence faces the mounting area. Said mirror area is preferably larger than the abovementioned cross-sectional area of the active region and is preferably formed from a metallization layer which, in a particularly preferred manner, is simultaneously used for electrical contact connection of the chip.

In the case of the chip according to an embodiment of the invention, the photon-emitting active region is far enough away from any electrically conductive connecting means for fixing the chip on a chip carrier, so that the risk of an electrical short circuit of the active region by the electrically conductive connecting means is eliminated to the greatest possible extent. The chip according to the invention can therefore be mounted reliably.

In a preferred embodiment of the component according to the invention, an area—facing toward the radiation direction of the chip—of a partial region of the coupling-out window which projects laterally beyond the active region has a curved surface, for example a surface curved circularly outward. Preferably, the curved surface runs completely around the active region, so that the coupling-out window has at least an outer contour approximated to a spherical-cap-like form.

In this case, the cross section of the active region and the radius $R_2$ of curvature of the curved surface of the coupling-out window are chosen such that the virtual active region arising as a result of the mirroring at the mirror area is located within the Weierstrass sphere assigned to the circular segment. This means, in particular, that the radii $R_2$ of curvature are greater than or equal to twice the height of the component. Moreover, half the maximum outer dimension $R_1$ of the active region along the coupling-out area is $R_1 < R_2$ $n_A/n_i$, where $n_i$ is the refractive index of the material of the coupling-out window and $n_A$ is the refractive index of the surroundings, formed in particular by a chip encapsulation.

With this arrangement, the chip approaches the ideal form according to Weierstrass, since the virtual active region lies within the Weierstrass sphere and the photons virtually generated there can leave the base body. See G. Winstel. C. Weyrich. "Ovto-Elektronik I". Springer-Verlag. 1980. p. 97.

The invention is particularly preferably suitable for chips in which the material of the coupling-out window has a larger refractive index than the material of the active region which adjoins the latter, said active region usually being formed as an active multilayer structure. As a result, the reflection of the radiation emitted by the active zone toward the rear at the interface between active region and coupling-out window is advantageously reduced and the radiation coupled into the coupling-out window is compressed.

The chip geometry according to the invention is particularly preferably used in nitride-based LED chips, in which the active multilayer structure is produced on an SiC or SiC-based growth substrate. Refractive index$_{active\ layer}$>refractive index$_{substrate}$ holds true in this case. GaN-based LED chips are LED chips whose radiation-emitting layer has, for example, GaN, InGaN, AlGaN and/or InGaAlN.

"Nitride-based" includes, in particular, all binary, ternary and quaternary nitrogen-containing III–V semiconductor mixed crystals, such as GaN, InN, AlN, AlGaN, InGaN, InAlN and AlInGaN.

Analogously to this, "SiC-based" means any mixed crystal whose essential properties are characterized by the constituents Si and C.

The layer sequence of the active region is preferably already grown on a substrate material which is later processed further to form coupling-out windows.

BRIEF DESCRIPTION OF THE DRAWINGS

The invention is explained in detail below with reference to the accompanying drawings, in which.

DETAILED DESCRIPTION OF THE DRAWINGS

Figure 1:
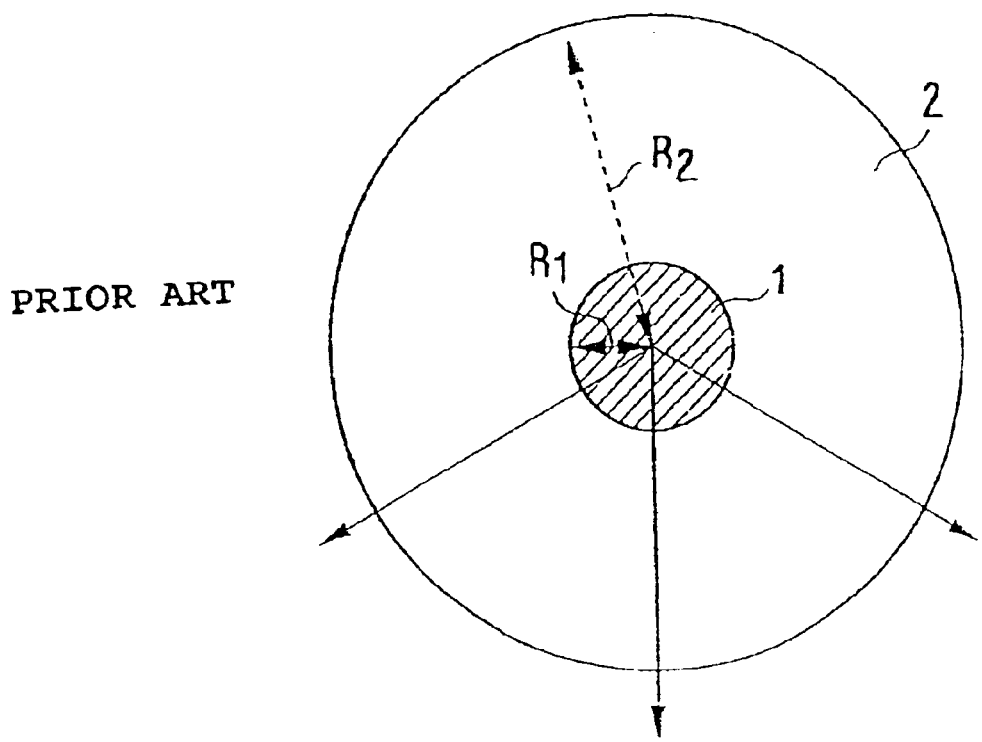
FIG. 1 shows a diagrammatic illustration of a cross section through an element which generates light following the Weierstrass principle.

The element illustrated in FIG. 1 has a cross section which is configured ideally according to Weierstrass. The element has an inner light-generating region 1 with a radius $R_1$. The light-generating region 1 is surrounded by an envelope 2 with a refractive index $n_i$ and a radius $R_2$. The envelope 2 is surrounded by a material with a refractive index $n_A$ (e.g. air or plastic encapsulation material). In order that the light generated in the light-generating region 1 can couple out completely from the envelope 2, the following must hold true: $R_1/R_2 < n_A/n_i$.

Figure 2:
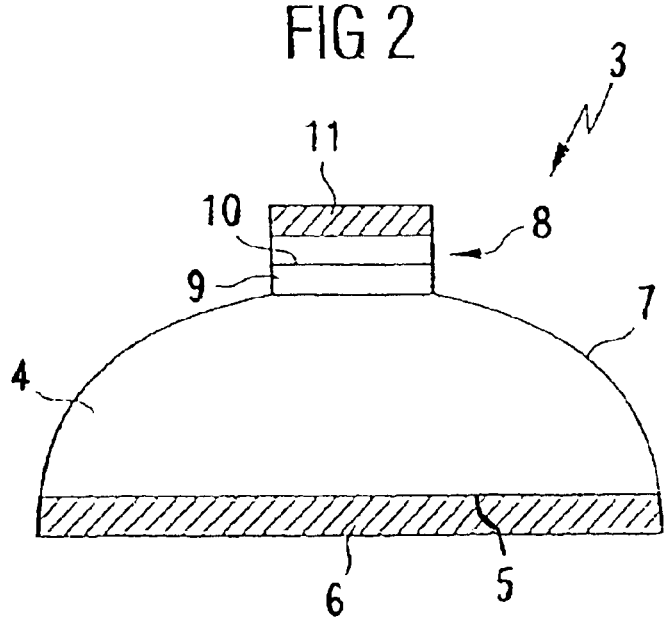
FIG. 2 shows a diagrammatic illustration of a cross section through a chip according to the invention.
Figure 3:
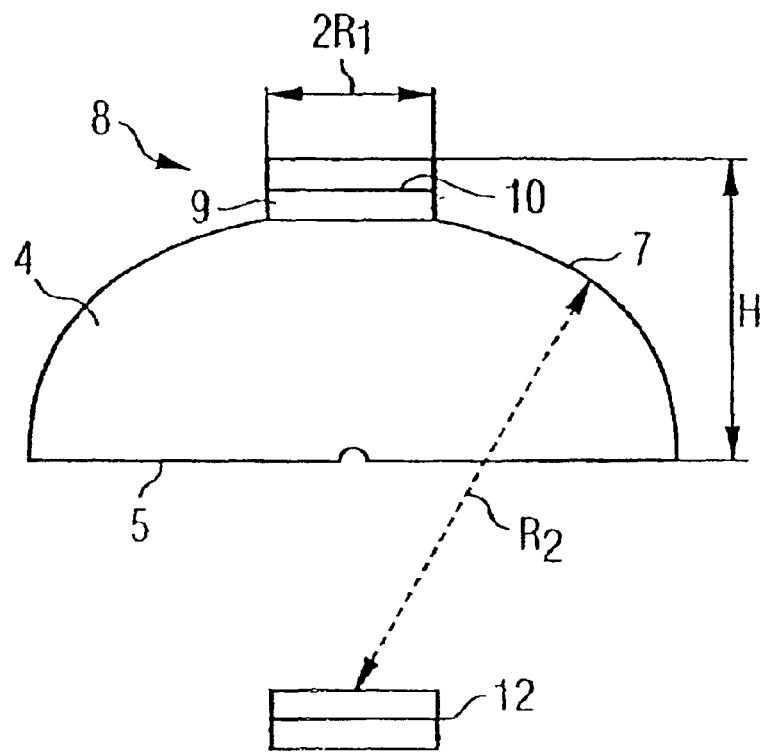
FIG. 3 shows a diagrammatic illustration of a cross section through the chip from FIG. 2 in which the position of the virtual active region is depicted.

FIG. 2 illustrates a cross section through a light-emitting diode (LED) chip 3, which has a spherical-cap-like coupling-out window 4 at whose base area 5 a mirror layer 6 is formed. Opposite the mirror layer 6, a photon-emitting active region 8 is provided on the coupling-out window 4. The active region 8 comprises a layer sequence 9 with a radiation-emitting zone 10, in particular a radiation-emitting pn junction 10, and is covered with a contact layer 11. Besides the layers of the radiation-emitting zone 10, the active region 8 may comprise further layers, for example layers concerning the crystalline or electrical matching, and/or also so-called covering layers. Such layer sequences are known and, therefore, are not explained in any further detail at this point. The mirror layer 6 may also be designed as a contact layer.

When current flows through the coupling-out window 4 and the active region 8, photons are generated in the radiation-generating zone 10 through recombination of charge carriers. Some of these generated photons are emitted toward the coupling-out window 4, reflected at the base area 5 and directed in large part in the direction of the coupling-out area 7. If they impinge there at an angle which is less than the critical angle for total reflection, the photons can pass through the coupling-out area 7 and leave the coupling-out window 4. The probability of the latter occurring is increased with a chip according to the invention in comparison with conventional chip geometries.

It is particularly advantageous if the geometrical relationships of the chip are chosen such that a virtual image 12 of the active region 8 is located in such a manner with respect to the coupling-out area 7 that the Weierstrass condition for the coupling-out of light without total reflection is met. This is the case if the radii $R_2$ of curvature of the coupling-out area 7 are chosen such that the following holds true:

$$2H - R_2 \frac{n_A}{n_i} \leq R_2 \leq 2H + R_2 \frac{n_A}{n_i},$$

preferably $R_2 = 2H$, where H is the height of the chip 3. Furthermore, the following must hold true for half the extent $R_1$ of the active region 8, the refractive index $n_1$ of the active region 8 and the refractive index $n_2$ of the coupling-out window 4: $R_1/R_2 < n_A/n_i$. In this case, a large part of the photons impinging on the mirror area 6 can couple out through the coupling-out area 7. What are excluded from this are essentially only those photons which are reflected back and forth between the mirror area 6 and the active region 8 or are absorbed again in the active region 8.

Figure 4:
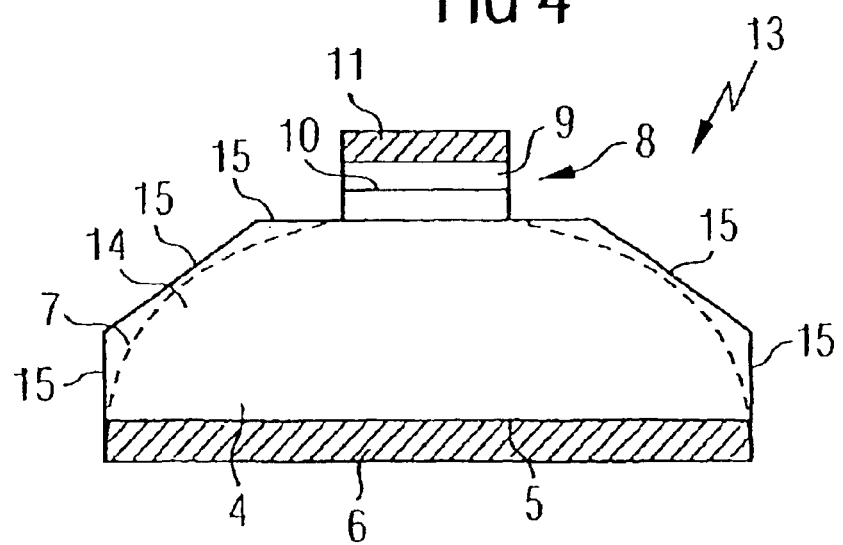
FIG. 4 shows a diagrammatic illustration of a cross section through a further exemplary embodiment of a chip according to the invention.

FIG. 4 illustrates a modified chip 13, whose coupling-out window 14 is formed like a truncated pyramid over a partial thickness proceeding from the interface with the active region 8 by means of side areas 15 running obliquely away from the chip axis. Together with the rest of the side areas of the coupling-out window 14, the obliquely running side areas 15 form a coupling-out area which is curved in a dome-like manner and whose envelope is approximately like a spherical cap. The latter is depicted by the broken line in FIG. 4. The chip illustrated in FIG. 4 is advantageous in so far as it can be produced in a simple manner and, at the same time, can be approximated to the ideal form according to Weierstrass.

Figure 5:
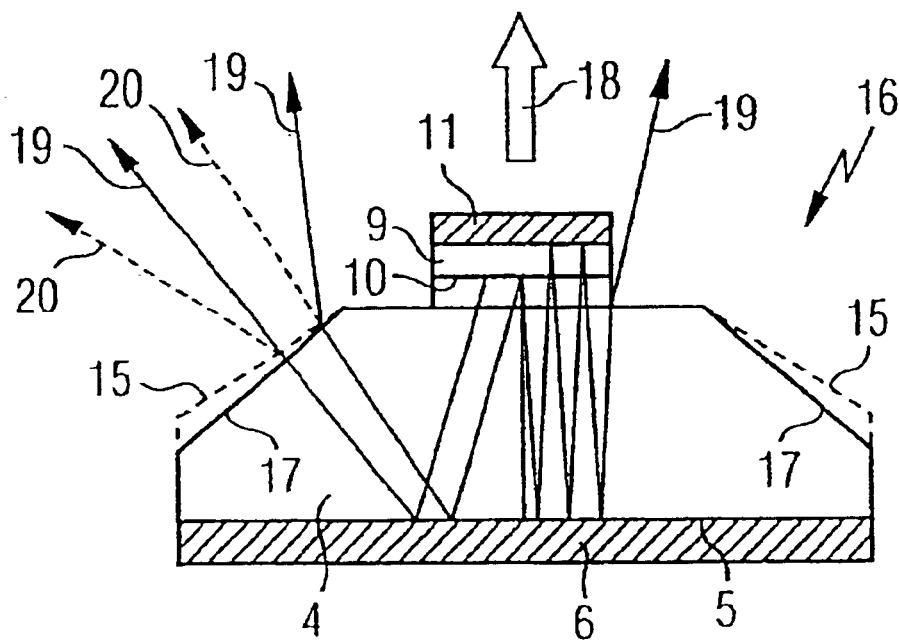
FIG. 5 shows a cross section through an exemplary embodiment with directional radiation.

In a departure from the chip 13 illustrated in FIG. 4, in the case of the chip 16 illustrated in FIG. 5, the obliquely running side areas 17 run at a more acute angle to the chip axis than the corresponding side areas 15 of the chip 13 of FIG. 4. The side areas 15 of the chip 13 are indicated by broken lines in FIG. 5. As a result of the more acute angle of the side areas 17, the radiation emerging from the chip 16 is concentrated in the direction of a radiating direction 18. This is illustrated by the photon trajectories which are depicted by solid lines in FIG. 5 and are oriented toward the radiating direction 18 to a greater extent compared with the photon trajectories 20 of the chip 13 from FIG. 4, which are depicted by broken lines.

Figure 6:
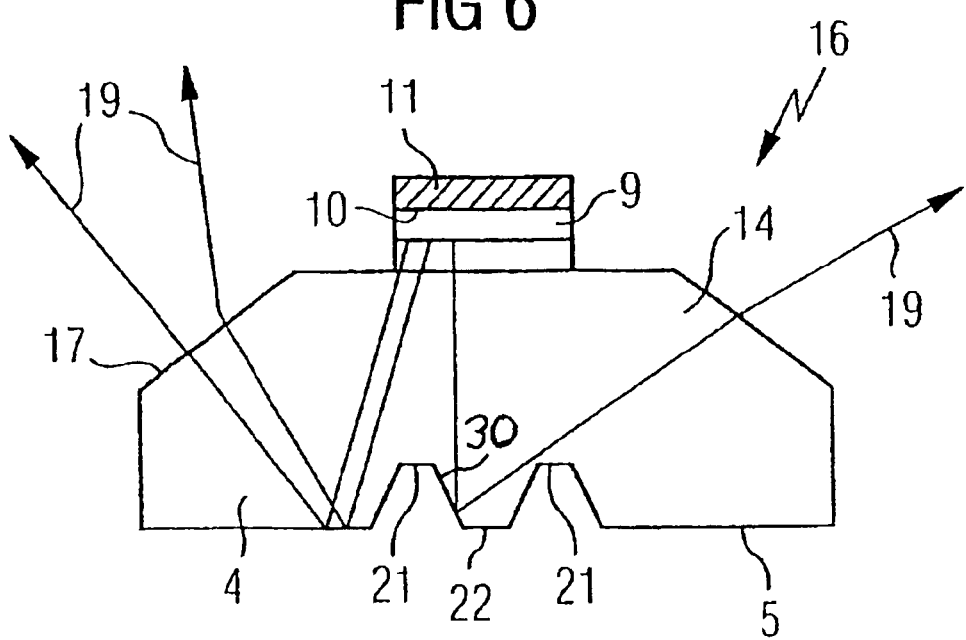
FIG. 6 shows a cross section through an exemplary embodiment whose mirror area has, below the active region, elevations directing the photons in a lateral direction.

It also becomes clear from FIG. 5 that some of the photon trajectories 19 run back and forth repeatedly between the contact layer 11 and the mirror layer 6. Photons having such trajectories are in part absorbed in the active region 8 and lost. As indicated in FIG. 6, this problem can at least be alleviated by providing areas 30 which are at an inclination with respect to the chip axis at that side of the coupling-out window 14 which is remote from the active region 8, which areas are preferably formed in mirroring fashion. The areas 30 which are at an inclination can direct said photon trajectories 19 in a lateral direction away from the chip axis, so that they are no longer reflected toward the active region 8, but rather toward a side area of the coupling-out window 14.

Such radiation deflecting areas 30 which are at an inclination with respect to the chip axis may be obtained for example through suitable structuring of the coupling-out window 14 by means of recesses 21 and elevations 22 lying in between below the active region 8 in the base area 5.

The recesses 21 can be produced for example by reactive ion etching (RIE) or by being introduced by sawing.

Figure 7:
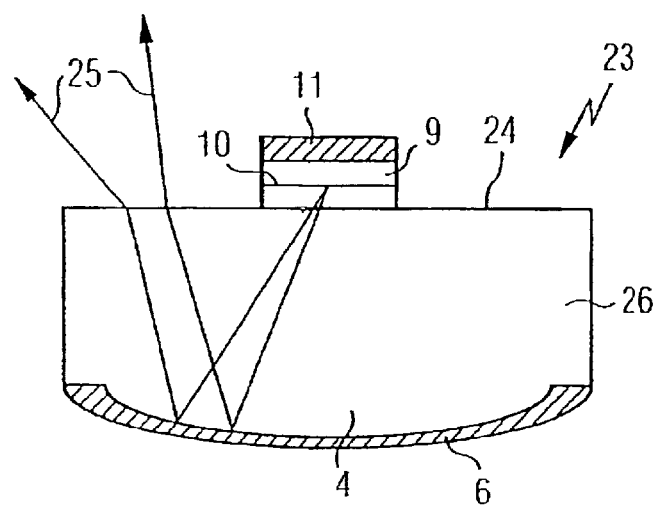
FIG. 7 shows an exemplary embodiment with a concave mirror area.

In the cross section through a further exemplary embodiment illustrated in FIG. 7, the coupling-out window 26 has, at its side remote from the active region 8, a mirror layer 6 having the form of a paraboloid-like concave mirror. The focal point of the mirror layer 6 is preferably situated in the active region 8. Through reflection at the mirror area 6, the photon trajectories emerging from the active region 8 are reflected in such a way that the photons impinge on the front side 24 of the coupling-out window 26 at an angle which is less than the critical angle for total reflection. This is illustrated using the photon trajectories 25 in FIG. 7. In addition to the paraboloid-like rear side of the chip, the top side 24 of the coupling-out window 26 may be designed as in the case of the chips in accordance with FIGS. 2, 4 and 5.

The chip geometry in accordance with FIG. 7 has the advantage that the coupling-out area is smaller at the front side of the window layer 26. The luminance is advantageously higher than in the case of the chip 3 in accordance with FIG. 2. The light can thus be imaged more easily by means of optics arranged downstream.

Figure 8:
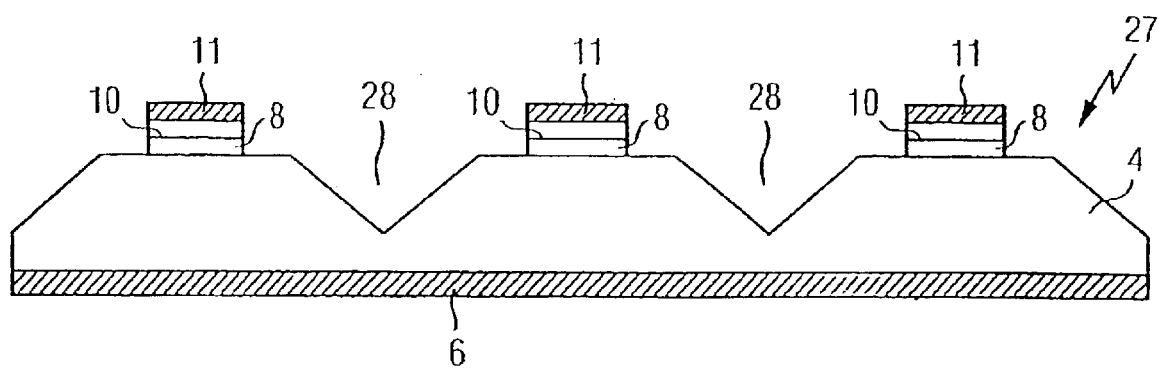
FIG. 8 shows a component with active regions which are arranged next to one another and are each assigned a coupling-out window section in the shape of a truncated pyramid.

Finally, it is possible, as illustrated in FIG. 8, for a plurality of chips 3, 13 or 23 to be arranged next to one another and connected to form a single chip 27. In this case, the side areas 15 are formed by depressions 28 in the coupling-out window 4. The depressions 28 are preferably introduced into the coupling-out window 4 by profile sawing.

In the exemplary embodiments illustrated in FIGS. 1 to 8, the mirror area 6 is in each case designed as a contact layer. However, it is also possible for the contact connection not to be performed over the whole area, but rather for a contact connection which partially covers the base area 5 to be accompanied by the provision of a mirror coating of the rest of the area. By way of example, a contact connection which partially covers the base area 5 may be of reticular or strip-type design. The contact layer formed along the base area 5 should expediently be located exactly opposite the upper contact layer 11 in order to keep the electrical losses low.

Figure 9:
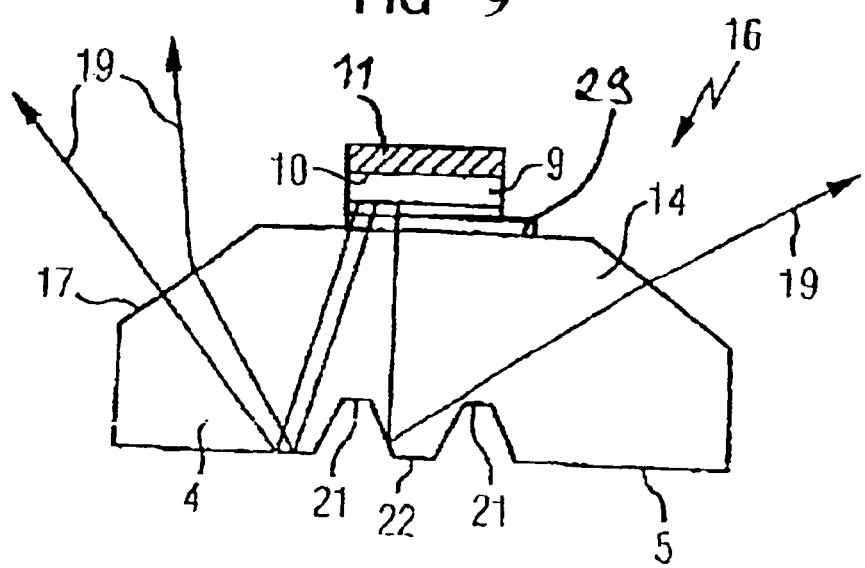
FIG. 9 shows a component having a contact connection between the active region and the coupling-out window.

As shown in FIG. 9, it is also possible to provide, instead of a contact connection along the base area, a contact connection 29 between the active region 8 and the coupling-out window 4 or 26 which is routed out laterally.

In the exemplary embodiments illustrated in FIGS. 2 to 8, the active region 8 is in each case arranged on a lens-type coupling-out window 4. It is also conceivable, in the case of the exemplary embodiments illustrated in FIGS. 2 to 6, to design the coupling-out window 4 in the shape of a Fresnel lens. Equally, in the case of the exemplary embodiment illustrated in FIG. 7, the mirror area 6 may have the shape of a Fresnel mirror.

Figure 10:
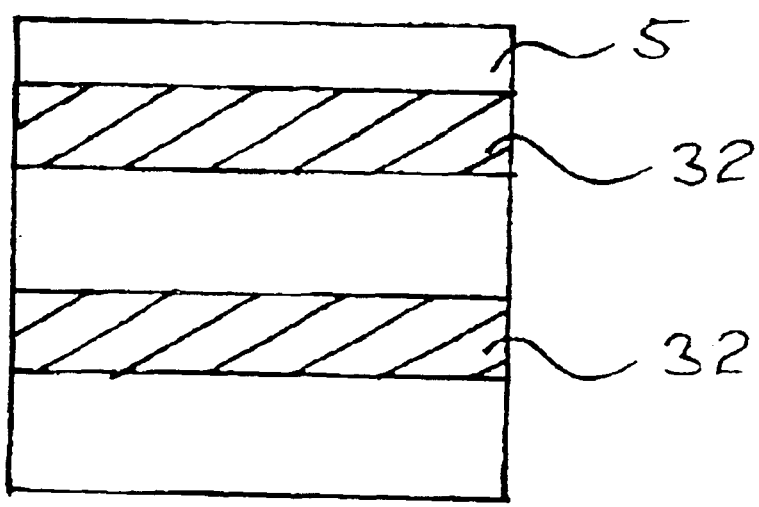
FIG. 10 shows a component having strip type or reticular contacts.

As shown in FIG. 10. the contacts may be of strip-type or reticular design 32, the interspaces between the strips or reticulated lines preferably being made reflective.

EXAMPLE 1

The coupling-out efficiency was investigated for the chip 16 in accordance with FIG. 5 with a base area 5 of 400 µm×400 µm and a pn junction 10 with an area of 120 µm×120 µm. The reflection at the mirror area 6 was 90% and the reflection at the contact layer 11 was 80%. The side areas 17 have an angle of inclination of 60 degrees. The coupling-out window 4 was produced from SiC and the active region 8 was produced on the basis of InGaN. In this case, 42% of the emitted photons were able to leave the chip 16.

EXAMPLE 2

In a further chip 16, which differs from the chip 16 from example 1 only by an angle of inclination of the side areas 17 of 45 degrees, the coupling-out efficiency was 39%.

COMPARATIVE EXAMPLE 1

In a conventional cube chip having the base area 400 µm×400 µm, a rear-side reflection of 90%, a front-side reflection at a contact of 80%, the coupling-out efficiency was 28%.

COMPARATIVE EXAMPLE 2

In a conventional cube chip having the base area 400 µm×400 µm and an absorbent front-side contact connection of 120 µm×120 µm and a further front-side, transparent contact for current expansion with a transmission of 50% and with a rear-side reflection of 90%, the coupling-out efficiency was 25%.

Investigations revealed that an increase in the luminous efficiency compared with a conventional cube chip by a factor of 1.7 is obtained in the case of the chip 16 illustrated in FIG. 5. The increase in the luminous efficiency is even significantly higher in the case of the exemplary embodiment illustrated in FIGS. 1 to 4.

The increase in the luminous efficiency is significant particularly in the case of chips emitting UV light, since the materials used for encapsulating the chips generally absorb UV light and, therefore, cannot be used. However, the chips 3, 13, 16 and 23 presented here have such a high coupling-out efficiency that an encapsulation can be dispensed with.

What is claimed is:

1. A chip for optoelectronics, in particular an LED chip, having a photon-emitting active region and a coupling-out window having at least one coupling-out area,
   wherein
   the active region is arranged downstream of the coupling-out window relative to a main radiation direction of the chip, wherein a mirror area is formed on that side of the coupling-out window which is opposite to the active region wherein the coupling-out areas project laterally beyond the side areas of the active region, and wherein a contact layer is formed between the active region and the coupling-out window.

2. The chip as claimed in claim 1,
   wherein
   the active region is a layer sequence formed on the coupling-out window.

3. The chip as claimed in claim 1,
   wherein
   the chip has a chip axis running through the active region.

4. The chip as claimed in claim 1,
   wherein
   the coupling-out window has a dome-like, in particular spherical-cap-like form, the coupling-out window tapering toward the active region.

5. The chip as claimed in claim 4,
   wherein
   a radius of curvature of a coupling-out area $R_2$ is greater than or equal $$2H - R_2 \frac{n_A}{n_i}$$

and less than or equal to $$2H + R_2 \frac{n_A}{n_i},$$

where H is equal to the to height of the chip.

6. The chip as claimed in claim 5,
   wherein
   the following holds true for half the maximum dimension $R_1$ of the layer sequence along the coupling-out area:

$R_1 < R_2 n_A / n_i$.

7. The chip as claimed in claim 1,
   wherein
   the coupling-out window is formed in the shape of a truncated pyramid at least in sections.

8. The chip as claimed in claim 7,
wherein
the coupling-out window formed in the shape of a truncated pyramid at least in sections envelopes a spherical segment.
9. The chip as claimed in claim 7,
wherein
the coupling-out window which is in the shape of a truncated pyramid at least in sections envelopes a rotational ellipsoid with a longitudinal axis running through the active region.
10. The chip as claimed in claim 1,
wherein
the coupling-out window is formed as a Fresnel lens.
11. The chip as claimed in claim 1,
wherein
the mirror area has, below the active region, elevations which direct the photons in a lateral direction.
12. The chip as claimed in claim 1,
wherein
the minor area is curved.
13. The chip as claimed in claim 12,
wherein
the mirror area is formed in concave fashion as seen from the active region.
14. The chip as claimed in claim 13,
wherein
the mirror area is formed as a paraboloid.
15. The chip as claimed in claim 1,
wherein
the mirror area is formed as a Fresnel mirror.
16. The chip as claimed in claim 1,
wherein
the mirror area serves as a contact area.
17. The chip as claimed in claim 1,
wherein
the mirror area is formed besides contact areas.
18. The chip as claimed in claim 17,
wherein
the contacts are formed in strip-type fashion.
19. The chip as claimed in claim 17,
wherein
the contacts are formed in reticulated fashion.
20. The chip as claimed in claim 17,
wherein
the contact area is opposite the active region.
21. The chip as claimed in claim 1,
wherein
a nitride-based active region is provided and the coupling-out window has SiC or SiC-based material.
22. The chip as claimed in claim 21,
wherein
a radiation-emitting layer of the active region has GaN, InGaN, AlGaN and/or InGaAlN.
23. The chip as claimed in claim 1,
wherein
the active region is grown on the coupling-out window.
24. A chip for optoelectronics, in particular an LED chip, having a photon-emitting active region and a coupling-out window having at least one coupling-out area,
wherein the active region is arranged downstream of the coupling window relative to a main radiation direction of the chip, wherein a mirror area is formed on that side of the coupling-out window which is opposite to the active region, wherein the coupling-out areas project laterally beyond the side areas of the active region, and wherein the material of the coupling-out window has a larger refractive index than the material of the active region.

* * * * *